US00RE43112E

(19) United States
(12) Reissued Patent
Corisis et al.

(10) Patent Number: US RE43,112 E
(45) Date of Reissued Patent: *Jan. 17, 2012

(54) STACKABLE BALL GRID ARRAY PACKAGE

(75) Inventors: David J. Corisis, Nampa, ID (US); Jerry M. Brooks, Palmer, AK (US); Walter L. Moden, Boise, ID (US)

(73) Assignee: Round Rock Research, LLC, Mt. Kisco, NY (US)

( * ) Notice: This patent is subject to a terminal disclaimer.

(21) Appl. No.: 11/438,125

(22) Filed: May 18, 2006

Related U.S. Patent Documents

Reissue of:
(64) Patent No.: 6,738,263
Issued: May 18, 2004
Appl. No.: 10/222,243
Filed: Aug. 16, 2002

U.S. Applications:
(60) Continuation of application No. 09/944,512, filed on Aug. 30, 2001, now Pat. No. 6,549,421, which is a continuation of application No. 09/416,249, filed on Oct. 12, 1999, now Pat. No. 6,331,939, which is a division of application No. 09/072,101, filed on May 4, 1998, now Pat. No. 6,072,233.

(51) Int. Cl.
*H01L 21/00* (2006.01)

(52) U.S. Cl. ..... 438/106; 438/25; 438/26; 438/64; 257/777; 361/736; 361/760; 361/767; 361/784; 361/790; 361/803; 174/52.4

(58) Field of Classification Search ..... 257/777, 257/686, 723, 778, 734, 787, 784, 782, 783, 257/780, 737, 738, 678; 438/15, 25, 26, 438/64, 106; 361/736, 760, 767, 784, 790, 361/791, 803; 174/52.4
See application file for complete search history.

(56) References Cited

U.S. PATENT DOCUMENTS
3,648,131 A 3/1972 Stuby
(Continued)

FOREIGN PATENT DOCUMENTS
JP 60-194548 10/1985
(Continued)

OTHER PUBLICATIONS
Anthony, T.R., "Forming electrical interconnections through semiconductor wafers," J. Appl. Phys., vol. 52, No. 8, Aug. 1981, pp. 5340-5349.
(Continued)

*Primary Examiner* — Tan N Tran
(74) *Attorney, Agent, or Firm* — Lerner, David, Littenberg, Krumholz & Mentlik, LLP

(57) ABSTRACT

A stackable FBGA package is configured such that conductive elements are placed along the outside perimeter of an integrated circuit (IC) device mounted to the FBGA. The conductive elements also are of sufficient size so that they extend beyond the bottom or top surface of the IC device, including the wiring interconnect and encapsulate material, as the conductive elements make contact with the FBGA positioned below or above to form a stack. The IC device, such as a memory chip, is mounted upon a first surface of a printed circuit board substrate forming part of the FBGA. Lead wires are used to attach the IC device to the printed board substrate and encapsulant is used to contain the IC device and wires within and below the matrix and profile of the conductive elements.

20 Claims, 8 Drawing Sheets

U.S. PATENT DOCUMENTS

| | | | | |
|---|---|---|---|---|
| 4,199,777 | A | | 4/1980 | Maruyama et al. |
| 4,371,912 | A | | 2/1983 | Guzik |
| 4,446,477 | A | | 5/1984 | Currie et al. |
| 4,483,067 | A | | 11/1984 | Parmentier |
| 4,505,799 | A | | 3/1985 | Baxter |
| 4,638,348 | A | | 1/1987 | Brown et al. |
| 4,649,418 | A | | 3/1987 | Uden |
| 4,725,924 | A | | 2/1988 | Juan |
| 4,731,645 | A | | 3/1988 | Parmentier et al. |
| 4,761,681 | A | | 8/1988 | Reid |
| 4,829,666 | A | | 5/1989 | Haghiri-Tehrani |
| 4,841,355 | A | | 6/1989 | Parks |
| 4,868,712 | A | | 9/1989 | Woodman |
| 4,899,107 | A | | 2/1990 | Corbett et al. |
| 4,931,853 | A | | 6/1990 | Ohuchi et al. |
| 4,954,458 | A | | 9/1990 | Reid |
| 4,956,694 | A | | 9/1990 | Eide |
| 4,975,765 | A | | 12/1990 | Ackermann et al. |
| 4,992,849 | A | | 2/1991 | Corbett et al. |
| 4,992,850 | A | | 2/1991 | Corbett et al. |
| 4,996,587 | A | | 2/1991 | Hinrichsmeyer et al. |
| 5,012,323 | A | | 4/1991 | Farnworth |
| 5,022,580 | A | | 6/1991 | Pedder |
| 5,041,396 | A | | 8/1991 | Valero |
| 5,043,794 | A | | 8/1991 | Tai et al. |
| 5,048,179 | A | | 9/1991 | Shindo et al. |
| 5,063,177 | A | | 11/1991 | Geller et al. |
| 5,068,205 | A | | 11/1991 | Baxter et al. |
| 5,075,253 | A | | 12/1991 | Sliwa et al. |
| 5,086,018 | A | | 2/1992 | Conru et al. |
| 5,099,309 | A | | 3/1992 | Kryzaniwsky |
| 5,107,328 | A | | 4/1992 | Kinsman et al. |
| 5,107,329 | A | | 4/1992 | Okinaga et al. |
| 5,128,831 | A | | 7/1992 | Fox, III et al. |
| 5,138,434 | A | | 8/1992 | Wood et al. |
| 5,155,067 | A | | 10/1992 | Wood et al. |
| 5,188,984 | A | | 2/1993 | Nishiguchi |
| 5,191,511 | A | | 3/1993 | Sawaya |
| 5,200,363 | A | | 4/1993 | Schmidt |
| 5,216,278 | A | | 6/1993 | Lin et al. |
| 5,218,234 | A | | 6/1993 | Thompson et al. |
| 5,222,014 | A | | 6/1993 | Lin |
| 5,231,304 | A | | 7/1993 | Solomon |
| 5,239,198 | A | | 8/1993 | Lin et al. |
| 5,239,447 | A | | 8/1993 | Cotues et al. |
| 5,258,330 | A | | 11/1993 | Khandros et al. |
| 5,266,912 | A | | 11/1993 | Kledzik |
| 5,286,679 | A | | 2/1994 | Farnworth et al. |
| 5,291,062 | A | | 3/1994 | Higgins, III |
| 5,293,068 | A | | 3/1994 | Kohno et al. |
| 5,294,750 | A | | 3/1994 | Sakai et al. |
| 5,299,092 | A | | 3/1994 | Yaguchi et al. |
| 5,311,401 | A | | 5/1994 | Gates, Jr. et al. |
| 5,313,096 | A | | 5/1994 | Eide |
| 5,326,428 | A | | 7/1994 | Farnworth et al. |
| 5,343,106 | A | | 8/1994 | Lungu et al. |
| 5,346,859 | A | | 9/1994 | Niwayama |
| 5,346,861 | A | | 9/1994 | Khandros et al. |
| 5,360,942 | A | | 11/1994 | Hoffman et al. |
| 5,373,189 | A | | 12/1994 | Massit et al. |
| 5,384,689 | A | | 1/1995 | Shen |
| 5,397,917 | A | | 3/1995 | Ommen et al. |
| 5,397,921 | A | | 3/1995 | Karnezos |
| 5,400,003 | A | | 3/1995 | Kledzik |
| 5,409,865 | A | | 4/1995 | Karnezos |
| 5,419,807 | A | | 5/1995 | Akram et al. |
| 5,420,460 | A | | 5/1995 | Massingill |
| 5,422,514 | A | | 6/1995 | Griswold et al. |
| 5,426,072 | A | | 6/1995 | Finnila |
| 5,434,106 | A | | 7/1995 | Lim et al. |
| 5,434,452 | A | | 7/1995 | Higgins |
| 5,454,161 | A | | 10/1995 | Beilin et al. |
| 5,468,999 | A | | 11/1995 | Lin |
| 5,473,512 | A | | 12/1995 | Degani et al. |
| 5,474,957 | A | | 12/1995 | Urushima |
| 5,486,723 | A | | 1/1996 | Ma et al. |
| 5,489,804 | A | | 2/1996 | Pasch |
| 5,508,556 | A | | 4/1996 | Lin |
| 5,528,080 | A | | 6/1996 | Goldstein |
| 5,536,685 | A | | 7/1996 | Burward-Hoy |
| 5,541,450 | A | | 7/1996 | Jones et al. |
| 5,545,291 | A | | 8/1996 | Smith et al. |
| 5,578,525 | A | * | 11/1996 | Mizukoshi ..... 29/840 |
| 5,578,869 | A | | 11/1996 | Hoffman et al. |
| 5,608,265 | A | | 3/1997 | Kitano et al. |
| 5,615,089 | A | | 3/1997 | Yoneda et al. |
| 5,616,958 | A | | 4/1997 | Laine et al. |
| 5,625,221 | A | | 4/1997 | Kim et al. |
| 5,625,227 | A | | 4/1997 | Estes et al. |
| 5,636,104 | A | | 6/1997 | Oh |
| 5,637,536 | A | | 6/1997 | Val |
| 5,637,915 | A | | 6/1997 | Sato et al. |
| 5,639,695 | A | | 6/1997 | Jones et al. |
| 5,639,696 | A | | 6/1997 | Liang et al. |
| 5,642,261 | A | | 6/1997 | Bond et al. |
| 5,648,679 | A | | 7/1997 | Chillara et al. |
| 5,663,593 | A | | 9/1997 | Mostafazadeh et al. |
| 5,668,405 | A | | 9/1997 | Yamashita |
| 5,674,785 | A | | 10/1997 | Akram et al. |
| 5,675,180 | A | | 10/1997 | Pedersen et al. |
| 5,677,566 | A | | 10/1997 | King et al. |
| 5,682,061 | A | | 10/1997 | Khandros et al. |
| 5,689,091 | A | | 11/1997 | Hamzehdoost et al. |
| 5,696,033 | A | | 12/1997 | Kinsman |
| 5,714,405 | A | | 2/1998 | Tsubosaki et al. |
| 5,723,907 | A | | 3/1998 | Akram |
| 5,729,432 | A | | 3/1998 | Shim et al. |
| 5,734,198 | A | | 3/1998 | Stave |
| 5,739,585 | A | | 4/1998 | Akram et al. |
| 5,739,588 | A | | 4/1998 | Ishida et al. |
| 5,741,622 | A | | 4/1998 | Arima |
| 5,744,862 | A | | 4/1998 | Ishii |
| 5,767,575 | A | | 6/1998 | Lan et al. |
| 5,770,347 | A | | 6/1998 | Saitoh et al. |
| 5,780,923 | A | | 7/1998 | Courtenay |
| 5,783,866 | A | | 7/1998 | Lee et al. |
| 5,783,870 | A | | 7/1998 | Mostafazadeh et al. |
| 5,789,803 | A | | 8/1998 | Kinsman |
| 5,796,586 | A | | 8/1998 | Lee et al. |
| 5,804,874 | A | | 9/1998 | An et al. |
| 5,804,880 | A | | 9/1998 | Mathew |
| 5,811,879 | A | | 9/1998 | Akram |
| 5,814,883 | A | | 9/1998 | Sawai et al. |
| 5,815,372 | A | | 9/1998 | Gallas |
| 5,818,698 | A | | 10/1998 | Corisis |
| 5,834,945 | A | | 11/1998 | Akram et al. |
| 5,835,988 | A | | 11/1998 | Ishii |
| 5,844,315 | A | | 12/1998 | Melton et al. |
| 5,848,467 | A | | 12/1998 | Khandros et al. |
| 5,852,326 | A | | 12/1998 | Khandros et al. |
| 5,883,426 | A | | 3/1999 | Tokuno et al. |
| 5,893,726 | A | | 4/1999 | Farnworth et al. |
| 5,903,049 | A | | 5/1999 | Mori |
| 5,915,169 | A | | 6/1999 | Heo |
| 5,915,977 | A | | 6/1999 | Hembree et al. |
| 5,920,118 | A | | 7/1999 | Kong |
| 5,931,685 | A | | 8/1999 | Hembree et al. |
| 5,933,710 | A | | 8/1999 | Chia et al. |
| 5,950,304 | A | | 9/1999 | Khandros et al. |
| 5,952,611 | A | | 9/1999 | Eng et al. |
| 5,962,921 | A | | 10/1999 | Farnworth et al. |
| 5,963,430 | A | | 10/1999 | Londa |
| 5,990,547 | A | * | 11/1999 | Sharma et al. ..... 257/700 |
| 5,994,166 | A | | 11/1999 | Akram et al. |
| 6,013,946 | A | | 1/2000 | Lee et al. |
| 6,013,948 | A | | 1/2000 | Akram et al. |
| 6,020,629 | A | | 2/2000 | Farnworth et al. |
| 6,028,365 | A | | 2/2000 | Akram et al. |
| 6,046,072 | A | | 4/2000 | Matsuura et al. |
| 6,048,755 | A | | 4/2000 | Jiang et al. |
| 6,057,597 | A | | 5/2000 | Farnworth et al. |
| 6,072,233 | A | | 6/2000 | Corisis et al. |
| 6,091,140 | A | | 7/2000 | Toh et al. |
| 6,097,085 | A | | 8/2000 | Ikemizu et al. |
| 6,097,087 | A | | 8/2000 | Farnworth et al. |
| 6,107,109 | A | | 8/2000 | Akram et al. |
| 6,133,627 | A | | 10/2000 | Khandros et al. |

| | | | | |
|---|---|---|---|---|
| 6,201,304 | B1 | 3/2001 | Moden | |
| 6,235,554 | B1 * | 5/2001 | Akram et al. | 438/109 |
| 6,262,477 | B1 | 7/2001 | Mahulikar et al. | |
| 6,265,766 | B1 | 7/2001 | Moden | |
| 6,268,649 | B1 | 7/2001 | Corisis et al. | |
| 6,331,939 | B1 | 12/2001 | Corisis et al. | |
| 6,372,527 | B1 | 4/2002 | Khandros et al. | |
| 6,392,306 | B1 | 5/2002 | Khandros et al. | |
| 6,433,419 | B2 | 8/2002 | Khandros et al. | |
| 6,455,928 | B2 | 9/2002 | Corisis et al. | |
| 6,465,893 | B1 | 10/2002 | Khandros et al. | |
| 6,825,569 | B2 | 11/2004 | Jiang et al. | |
| 6,861,290 | B1 | 3/2005 | Moden | |
| 6,869,827 | B2 * | 3/2005 | Vaiyapuri | 438/109 |
| 2001/0030370 | A1 | 10/2001 | Khandros et al. | |
| 2002/0000652 | A1 * | 1/2002 | Goh | 257/734 |
| 2002/0155728 | A1 | 10/2002 | Khandros et al. | |
| 2003/0168253 | A1 | 9/2003 | Khandros et al. | |
| 2005/0087855 | A1 | 4/2005 | Khandros et al. | |

FOREIGN PATENT DOCUMENTS

| | | |
|---|---|---|
| JP | 4-30544 | 2/1992 |
| JP | 4-107964 | 4/1992 |
| JP | 07-283274 | 10/1995 |

OTHER PUBLICATIONS

"Chip Scale Review," vol. 1, No. 1, May 1997.
Roget's II, The New Thesaurus, 3rd Edition, Houghton Mifflin Company, 1995, p. 213.
Random House Webster's College Dictionary, Random House, New York, 1997, p. 297.

* cited by examiner

STACKABLE BALL GRID ARRAY PACKAGE

Matter enclosed in heavy brackets [ ] appears in the original patent but forms no part of this reissue specification; matter printed in italics indicates the additions made by reissue.

*RELATED REISSUE APPLICATIONS*

*More than one reissue application has been filed for the reissue of U.S. Pat. No. 6,738,263. The reissue applications are U.S. application Ser. No. 09/944,512, filed Aug. 30, 2001, now U.S. Pat. No. 6,549,421, issued Apr. 15, 2003, which is a continuation of U.S. application Ser. No. 09/416,249, filed Oct. 12, 1999, now U.S. Pat. No. 6,331,939, issued Dec. 18, 2001, which is a divisional of U.S. application Ser. No. 09/072,101, filed May 4, 1998, now U.S. Pat. No. 6,072,233, issued Jun. 6, 2000.*

CROSS-REFERENCE TO RELATED APPLICATIONS

This application *is a continuation reissue application of U.S. application Ser. No. 10/222,243, filed Aug. 16, 2002, now U.S. Pat. No. 6,738,263, issued May 18, 2004, which* is a continuation of U.S. application Ser. No. 09/944,512, filed Aug. 30, 2001, [pending] *now U.S. Pat. No. 6,549,421, issued Apr. 15, 2003*, which is a continuation of U.S. application Ser. No. 09/416,249, filed Oct. 12, 1999, now U.S. Pat. No. 6,331, 939, issued Dec. 18, 2001, which is a divisional of U.S. application Ser. No. 09/072,101, filed May 4, 1998, now U.S. Pat. No. 6,072,233, issued Jun. 6, 2000.

BACKGROUND OF THE INVENTION

The present invention relates generally to packaging semiconductor devices and, more particularly, the present invention relates to fine ball grid array packages that can be stacked to form highly dense components.

Ball grid array (BGA) semiconductor packages are well known in the art. BGA packages typically comprise a substrate, such as a printed circuit board, with a semiconductor die mounted on the top side of the substrate. The semiconductor die has a multitude of bond pads electrically connected to a series of metal traces on the top side of the printed circuit board. The connection between the bond pads and the metal traces is provided by wire bonds electrically and mechanically connected between the two. This series of metal traces is connected to a second series of metal traces on the underside of the printed circuit board through a series of vias. The second series of metal traces each terminate with a connect contact pad where a conductive element is attached. The conductive elements can be solder balls or conductive filled epoxy. The conductive elements are arranged in an array pattern and the semiconductor die and wire bonds are encapsulated with a molding compound.

As chip and grid array densities increase, the desire in packaging semiconductor chips has been to reduce the overall height or profile of the semiconductor package. The use of BGAs has allowed for this reduction of profile as well as increased package density. Density reduction has been achieved by utilizing lead frames, such as lead-over chips, in order to increase the densities as well as to branch out into being able to stack units one on top another.

One example of a lead chip design in a BGA package is shown in U.S. Pat. No. 5,668,405, issued Sep. 16, 1997. This patent discloses a semiconductor device that has a lead frame attached to the semiconductor chip. Through holes are provided that allow for solder bumps to connect via the lead frame to the semiconductor device. This particular reference requires several steps of attaching the semiconductor device to the lead frame, then providing sealing resin, and then adding a base film and forming through holes in the base film. A cover resin is added before solder bumps are added in the through holes to connect to the lead frame. This particular structure lacks the ability to stack devices one on top another.

U.S. Pat. No. 5,677,566, issued Oct. 14, 1997, and commonly assigned to the assignee of the present invention, discloses a semiconductor chip package that includes discrete conductive leads with electrical contact bond pads on a semiconductor chip. The lead assembly is encapsulated with a typical encapsulating material and electrode bumps are formed through the encapsulating material to contact the conductive leads. The electrode bumps protrude from the encapsulating material for connection to an external circuit. The semiconductor chip has the bond leads located in the center of the die, thus allowing the conductive leads to be more readily protected once encapsulated in the encapsulating material. Unfortunately, this particular assembly taught in the '566 patent reference also lacks the ability to stack one semiconductor device on top another.

Attempts have been made to stack semiconductor devices in three dimensional integrated circuit packages. One such design is disclosed in U.S. Pat. No. 5,625,221, issued Apr. 29, 1997. This patent discloses a semiconductor package assembly that has recessed edge portions that extend along at least one edge portion of the assembly. An upper surface lead is exposed therefrom and a top recess portion is disposed on a top surface of the assembly. A bottom recess portion is disposed on the bottom surface of the assembly such that when the assembly is used in fabricating a three-dimensional integrated circuit module, the recessed edge portion accommodates leads belonging to an upper semiconductor assembly to provide electrical interconnection therebetween. Unfortunately, the assembly requires long lead wires from the semiconductor chip to the outer edges. These lead wires add harmful inductance and unnecessary signal delay and can form a weak link in the electrical interconnection between the semiconductor device and the outer edges. Further, the device profile is a sum of the height of the semiconductor die, the printed circuit board to which it is bonded, the conductive elements, such as the solder balls, and the encapsulant that must cover the die and any wire bonds used to connect the die to the printed circuit board. So, reducing the overall profile is difficult because of the geometries required in having the lead pads on the semiconductor chip along the outer periphery with extended lead wires reaching from the chip to the outer edges.

Another stacked arrangement of semiconductor devices on a substrate interconnected by pins is illustrated in U.S. Pat. Nos. 5,266,912 and 5,400,003. However, the height of the stacked package is limited by the length of the pin connections between the individual multi-chip modules or printed circuit boards.

Accordingly, what is needed is a ball grid array package that allows stacking of packages on one another. This stackable package would have a lower profile than otherwise provided in the prior art and would reduce the number of steps in the assembly of the package.

SUMMARY OF THE INVENTION

According to the present invention, a stackable fine ball grid array (FBGA) package is disclosed that allows the stacking of one array upon another. This stackable FBGA package is configured such that conductive elements are placed along the outside perimeter of a semiconductor device (integrated circuit (IC) device) mounted to the FBGA. The conductive elements also are of sufficient size so that they extend beyond the bottom or top surface of the IC device. Wire interconnect connects the IC device in a way that does not increase the overall profile of the package. Encapsulating material protects both the IC device and the wire interconnect as the conductive elements make contact with the FBGA positioned below or above to form a stack. The IC device, such as a memory chip, is mounted upon a first surface of a printed circuit board substrate forming part of the FBGA. Lead wires, or wire interconnect, are used to attach the IC device to the printed circuit board substrate and an encapsulant is used to contain the IC device and wires within and below the matrix and profile of the conductive elements.

Additionally, certain pins on the FBGA in the stack require an isolated connection to the PC board. An example of such a requirement is when an activation signal for a particular IC device within the stack must be sent solely to that device and not to any of the other devices within the stack. This isolated connection connects to an adjacent ball on a different FBGA stack above or below that particular isolated connection since in common pin layouts of the devices are stacked together, and each device requires an isolated connection to the PC board. This provides for a stair step connection from the bottom of the FBGA stacked array to the top that allows each device, from the bottom one to the top one, to have an isolated connection from each other. This allows IC devices to be stacked one upon the other while maintaining a unique pin out for each pin required in the stack.

Further, the FBGA of the present invention keeps the wire lengths between the IC device and the conductors of the PC board to a minimum for the control of the impedance of the conductors.

DETAILED DESCRIPTION OF THE INVENTION

Figure 1:
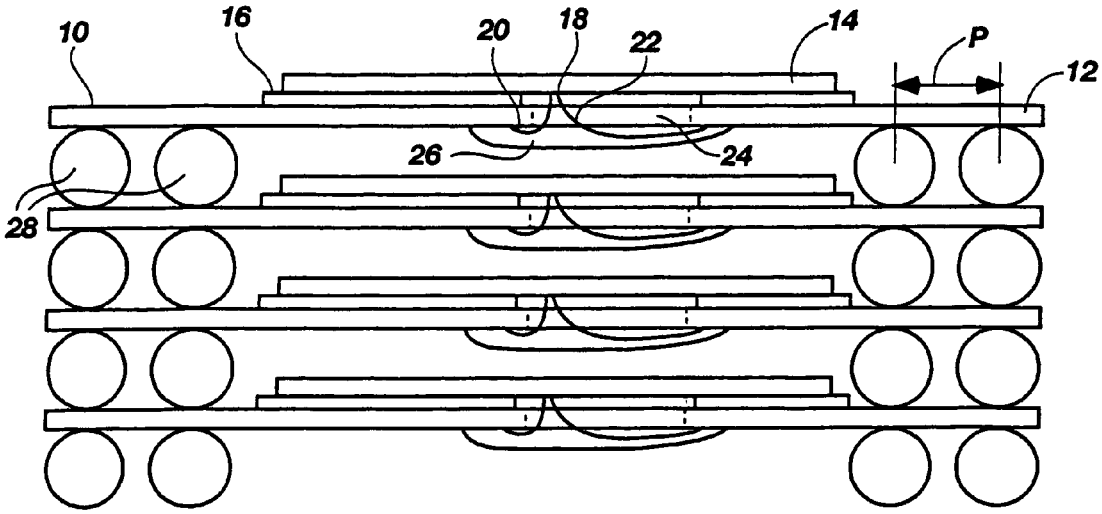
FIG. 1 depicts a schematic cross-sectional representation of a stacked array of FBGAs according to the present invention.

Referring to drawing FIG. 1, illustrated in a cross-sectional view is a plurality of fine ball grid array (FBGA) packages 10 in a stacked arrangement. Each FBGA package 10 is stacked one upon another via a matrix of conductive elements or solder balls 28 having a first height. Each FBGA package 10 includes a substrate 12 that has conductive traces formed both on the top surface and the bottom surface. Substrate 12 may be formed from an organic epoxy-glass resin base material, such as bismaleimide-triazin (BT) resin or FR-4 board, but is not limited thereto. Other carrier substrate materials well known to those skilled in the art may also be utilized instead, such as, for example, either a ceramic or silicon substrate.

FBGA package 10 further comprises an integrated circuit or semiconductor die 14 attached to a die attach pad 16 formed on the upper surface of substrate 12. Semiconductor die 14 is attached to die attach pad 16 using a dielectric adhesive that is nonconductive and has a thermal coefficient of expansion (TCE) that closely matches that of the semiconductor die 14. The adhesive can be any type of epoxy resin or other polymer adhesives typically used for such purposes. Alternately, the die attach pad 16 may be formed of double sided, adhesively coated tape, such as an adhesively coated Kapton™ tape or the like. The semiconductor die 14 is formed having a plurality of bond pads 18 that is formed on the active surface thereof which mates with die attach pad 16 of the substrate 12. Each bond pad of the plurality of bond pads 18 aligns with a corresponding aperture 24 in substrate 12. Each bond pad of the plurality of bond pads 18 is electrically connected to terminal pads 20 that are on the surface of substrate 12. Wire bonds 22 are used to form the connections between the plurality of bond pads 18 on the semiconductor die 14 and the terminal pads 20 of the substrate 12 wherein the wire bonds 22 pass through an aperture 24 formed in the substrate 12. A portion of semiconductor die 14 where the bond pads 18 are located, along with the cavity formed by aperture 24, is covered by an encapsulating material 26. Encapsulating material 26 covers or seals bond pads 18, terminal pads 20, and wire bonds 22 to protect them from dust, moisture, and any incidental contact. The encapsulating material 26 has a second height, the second height being less than the first height of the conductive elements 28.

Conductive elements 28 are attached or bonded to conductive traces 30 (see FIG. 2) of substrate 12. Conductive elements 28 may be selected from acceptable bonding substances such as solder balls, conductive or conductor-filled epoxy, and other substances known to those skilled in the art. The conductive elements 28, which, for example, are solder balls, may be attached, as is known in the art, by coating the solder balls or bond areas or both with flux, placing the solder balls 28 on the conductive traces 30 with conventional ball placing equipment and reflowing the balls in place using an infrared or hot air reflow process. The excess flux is then removed with an appropriate cleaning agent. In this way, the solder balls 28 are electrically and mechanically connected to the conductive leads to form the external electrodes. Other processes may also be used to form external electrodes. For example, the electrodes may be "plated up" using conventional plating techniques rather than using solder balls as described above. The completed FBGA packages 10 can then be attached to a printed circuit board or the like using conventional surface mount processes and equipment. Likewise, each FBGA package 10 can be mounted one on top another, stacked, as is illustrated in drawing FIG. 1. Solder balls 28 may have a diameter of approximately 0.6 mm with a pitch P that is 0.80 mm. The profile for each FBGA package 10, as measured from the bottom of solder balls 28 to the top of the semiconductor die, may range from 1.0 mm to 1.22 mm.

Figure 2:
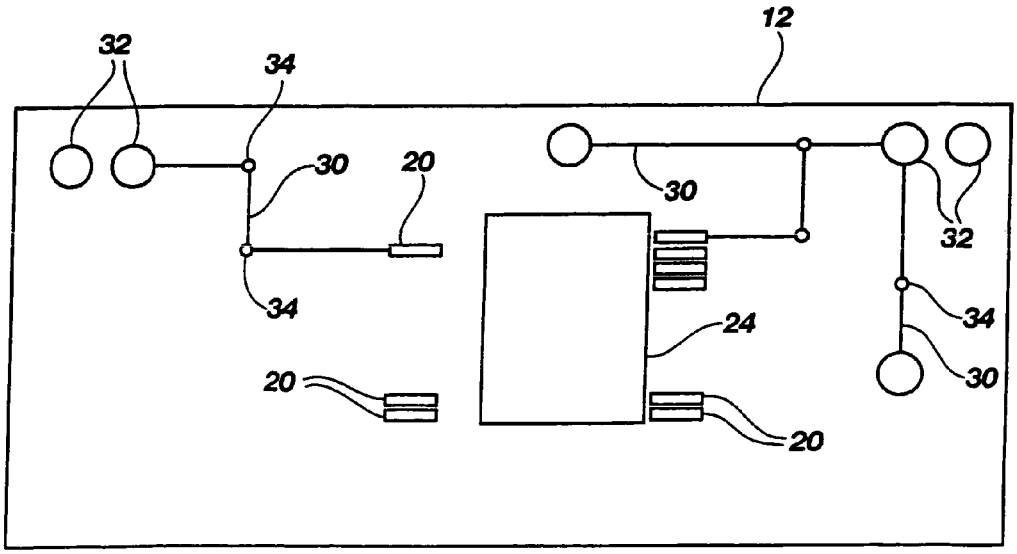
FIG. 2 depicts a top plan view of a representative circuit board as used in the array of FIG. 1.
Figure 3:
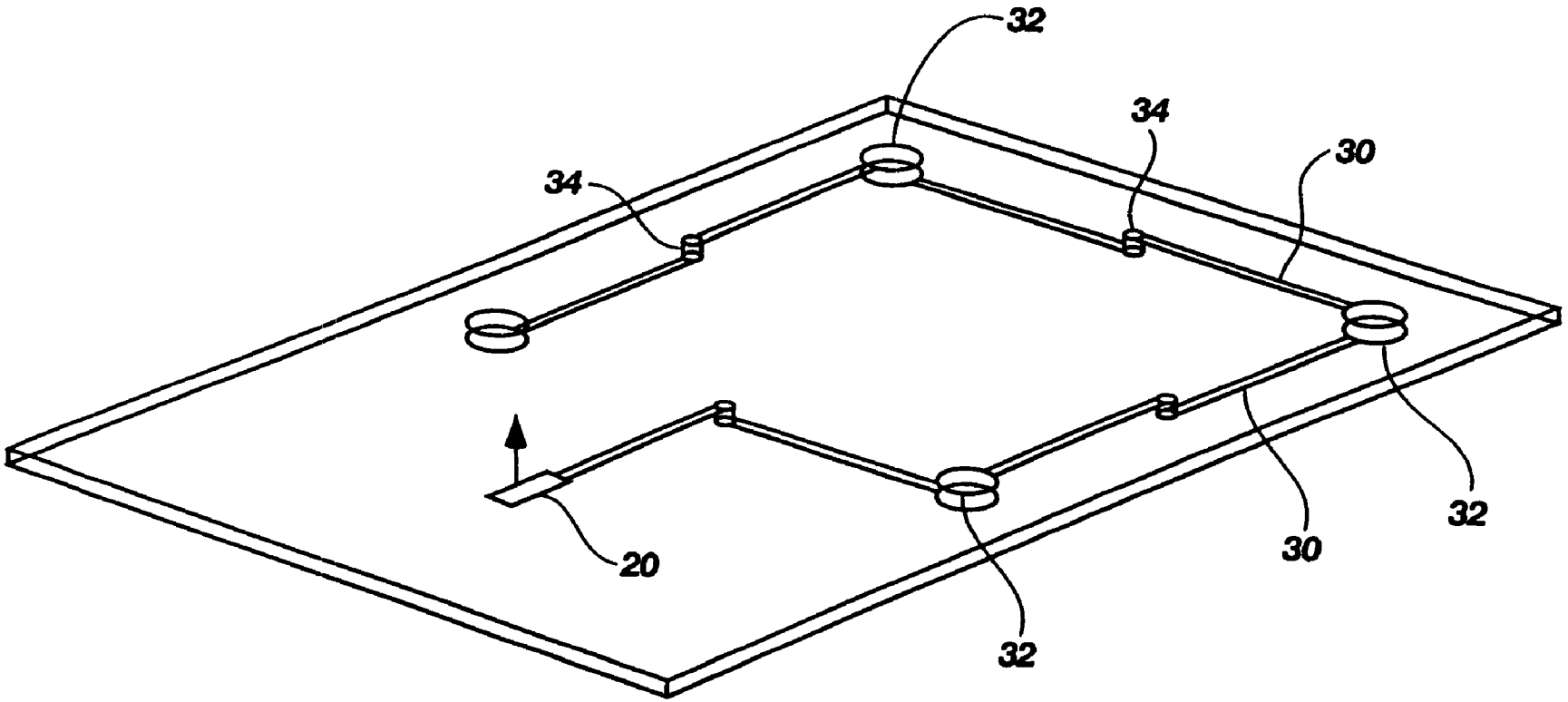
FIG. 3 depicts a perspective view of a printed circuit board having traces connected one to another with vias and contact through holes.

Next, as illustrated in drawing FIG. 2, is a top plan view of the bottom surface of substrate 12. This bottom surface includes pass-through aperture 24 where the wire bonds (not shown) are attached to terminal pads 20. Each terminal pad 20 is connected to a metal conductive trace 30, which further connects to a conductive element pad 32. Conductive element pads 32 are placed on either side of substrate 12 and are located where the conductive elements 28 of drawing FIG. 1 are mounted. Additionally, as conductive element pads 32 are placed on the opposite side of substrate 12, they provide a pass-through connection for the stacking of FBGA packages 10 as shown in drawing FIG. 1. Conductive traces 30 are electrically connected to conductive traces on the opposite side (not shown) using vias 34. Conductive traces 30 may be comprised of electrically conductive material such as copper or copper plated with gold. While conductive traces 30 are illustrated in drawing FIG. 2 on the top and bottom of the substrate 12, other conductive traces 30 (not shown) may be located in the substrate 12 along with other vias 34 therein and conductive element pads 32 in addition to those illustrated. Depicted in drawing FIG. 3 is a perspective view of a three dimensional drawing of how conductive traces 30 may be laid out on both the top surface and bottom surface of substrate 12. Additionally, the conductive element pads 32 are also shown to provide connection on either side of substrate 12. Conductive traces 30 are on both sides connected using vias 34 as well as the conductive elements pads 32. The conductive traces 30 are also connected to terminal pads 20. The aperture 24 through substrate 12 may be any desired size in relation to the semiconductor die 14 as may be necessary. Also, the substrate 12 may have portions thereof removed after the mounting of the semiconductor die 14 thereon.

Figure 4:
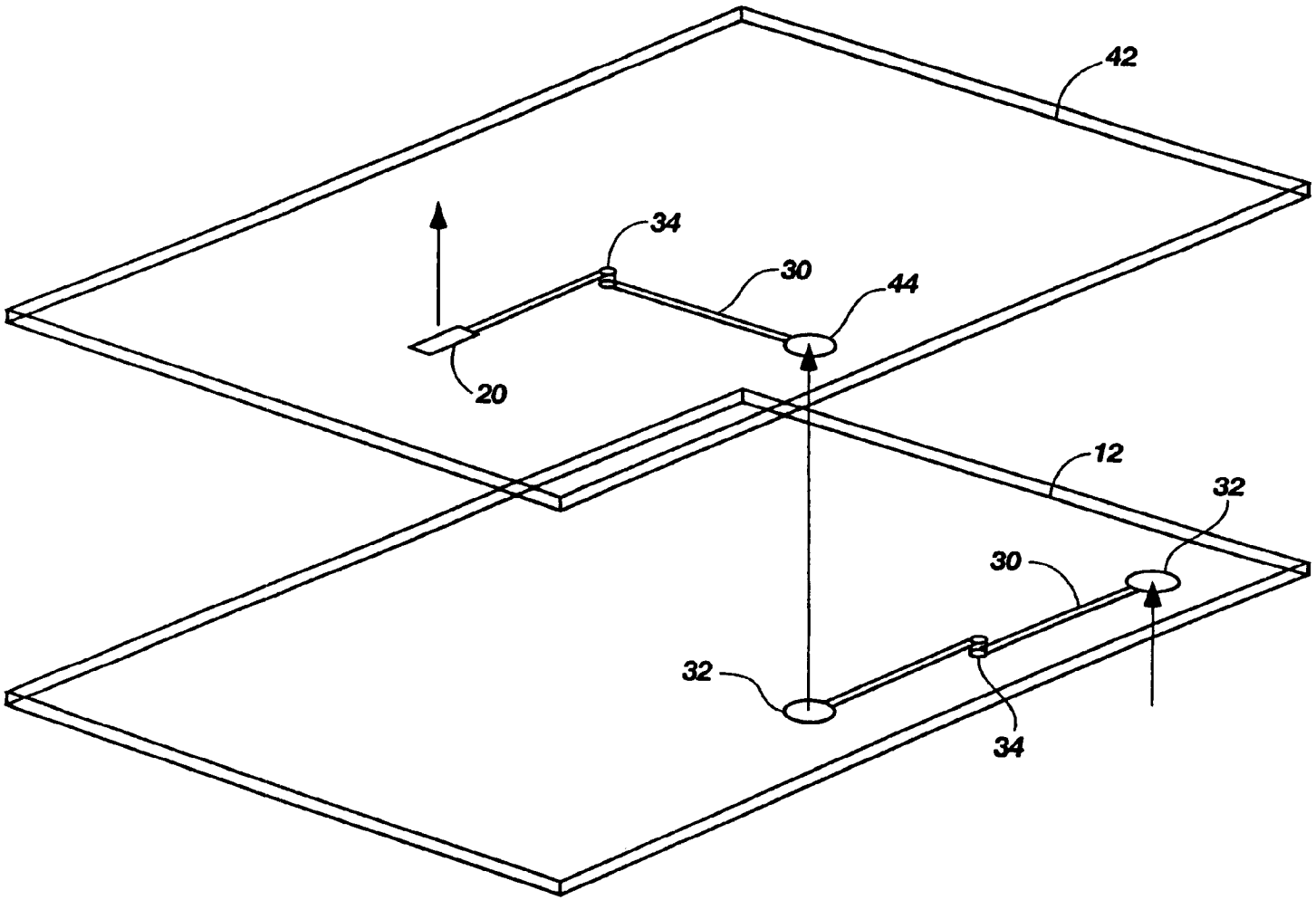
FIG. 4 depicts a perspective view of a pair of different printed circuit boards having an electrical connection extending from one location on one board to another location on the second board.
Figure 5:
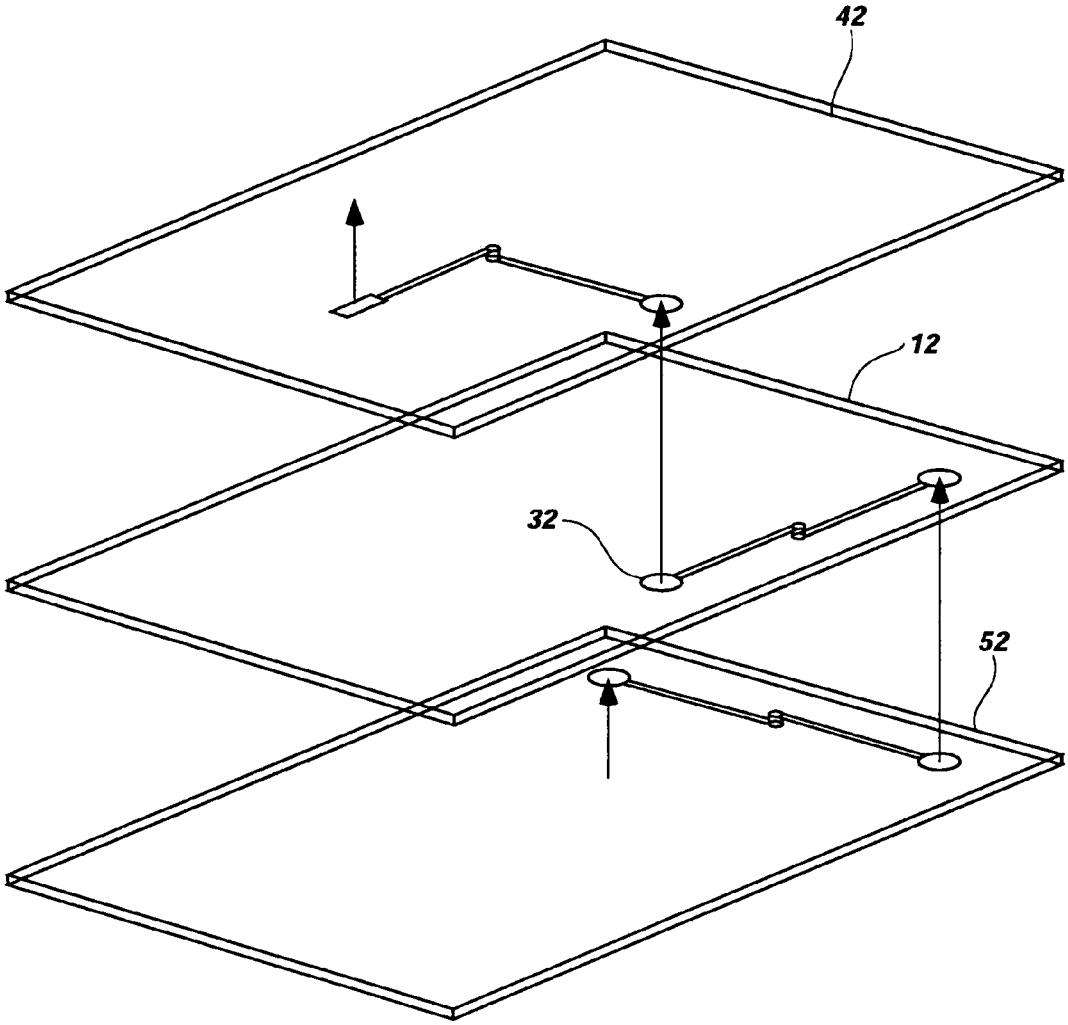
FIG. 5 depicts a perspective view of multiple PC boards interconnected in a manner according to the present invention.

Depicted in drawing FIG. 4 is an expanded view of the three-dimensional arrangement of substrates 12 achieved using the pass-through holes or vias 34 in conjunction with conductive traces 30 of the substrates 12 to form a stacked arrangement. A first substrate 12 is provided to connect to a second substrate 42. The connection occurs at conductive element pad 32 on substrate 12 and a like conductive element pad 44 on second substrate 42. Next, conductive element pad 44 on second substrate 42 connects to a conductive trace 30 on the surface of second substrate 42, which then passes from one side of second substrate 42 using via 34 to connect to a bond pad on the opposite side of second substrate 42. Referring to drawing FIG. 5, depicted is the manner in which the stepping of conductive traces can continue to yet another level. Referring to drawing FIG. 5, depicted is a third conductive substrate 52 placed below substrate 12 having additional conductive element pads 32 on either side thereof that provide connection to the adjacent substrate 12, which then, in turn, provides connection to second substrate 42. The arrows represent the plane connection on semiconductor packages yet to be added.

Figure 6:
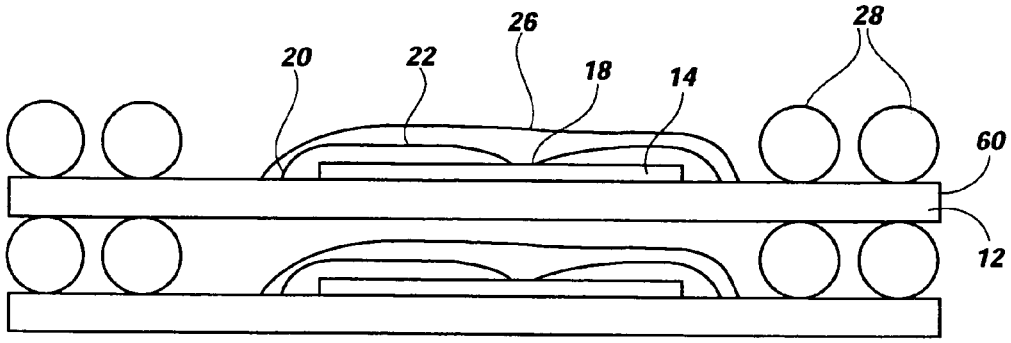
FIG. 6 is an alternative embodiment of a stackable array according to the present invention.

Referring to drawing FIG. 6, depicted is an alternative embodiment of the invention where a semiconductor die 14 is mounted on the upper surface of substrate 12. Wire bonds 22 are then used to connect the bond pads 18 on the active surface of the semiconductor die 14 to the terminal pads 20 of substrate 12. Encapsulating material 26 is then provided to cover the semiconductor die 14, wire bonds 22, bond pads 18 and terminal pads 20. Next, conductive elements 28 are then mounted on the upper surface of substrate 12 around the perimeter of semiconductor die 14. As illustrated, this arrangement allows the stacking of multiple die packages 60. It is understood that the substrate 12 includes circuitry and vias (not shown) as described hereinbefore in drawing FIGS. 2 through 5.

Figure 7:
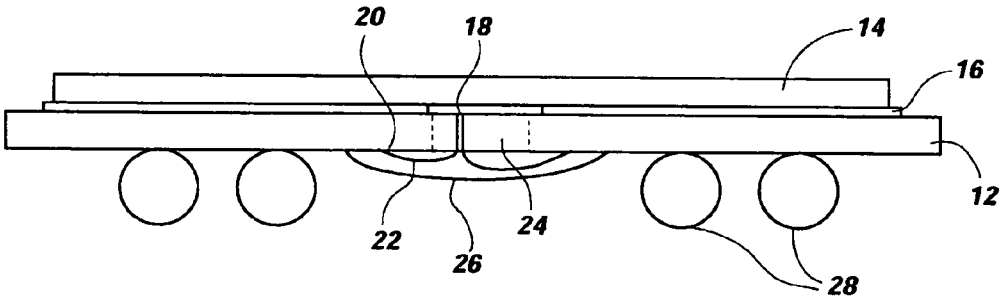
FIG. 7 depicts another embodiment where the ball grid array matrix extends below the semiconductor device.

A third embodiment of the present invention is depicted in drawing FIG. 7. Referring to drawing FIG. 7, shown in a cross-sectional diagram is the manner in which a semiconductor die 14 can extend near to the peripheral edges of substrate 12. In this case, conductive elements 28 are no longer outside the perimeter of semiconductor die 14. Again, wire bonds 22 interconnect bond pads 18 of the semiconductor die 14 to terminal pads 20 on substrate 12. Encapsulating material 26 is utilized to cover the aperture 24, the bond pads 18, terminal pads 20, and wire bonds 22. This particular arrangement of the substrate 12 and semiconductor die 14 may be used as either a bottom level or as a top level in a stacked array, typically, with the use of an interposer.

Figure 8:
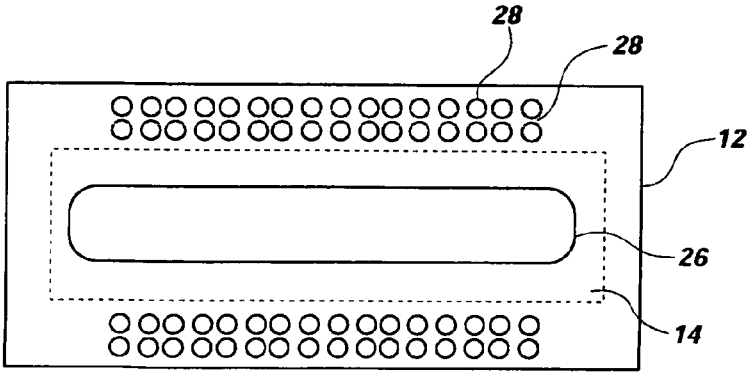
FIG. 8 depicts a bottom plan view of an FBGA device found in FIG. 1.

Referring to drawing FIG. 8, depicted is a bottom plan view of a semiconductor package 10 as illustrated in drawing FIG. 1. In this example, substrate 12 has a plurality of solder balls 28 mounted along the perimeter of semiconductor die 14, which is shown in outline form. The conductive elements 28 form a connective matrix for connecting to the top surface of another substrate 12 or to the top surface of a carrier substrate that provides external electrical connectivity for the module. Encapsulating material 26 covers the wire leads and bonding pads on either substrate 12 or semiconductor die 14.

Figure 9:
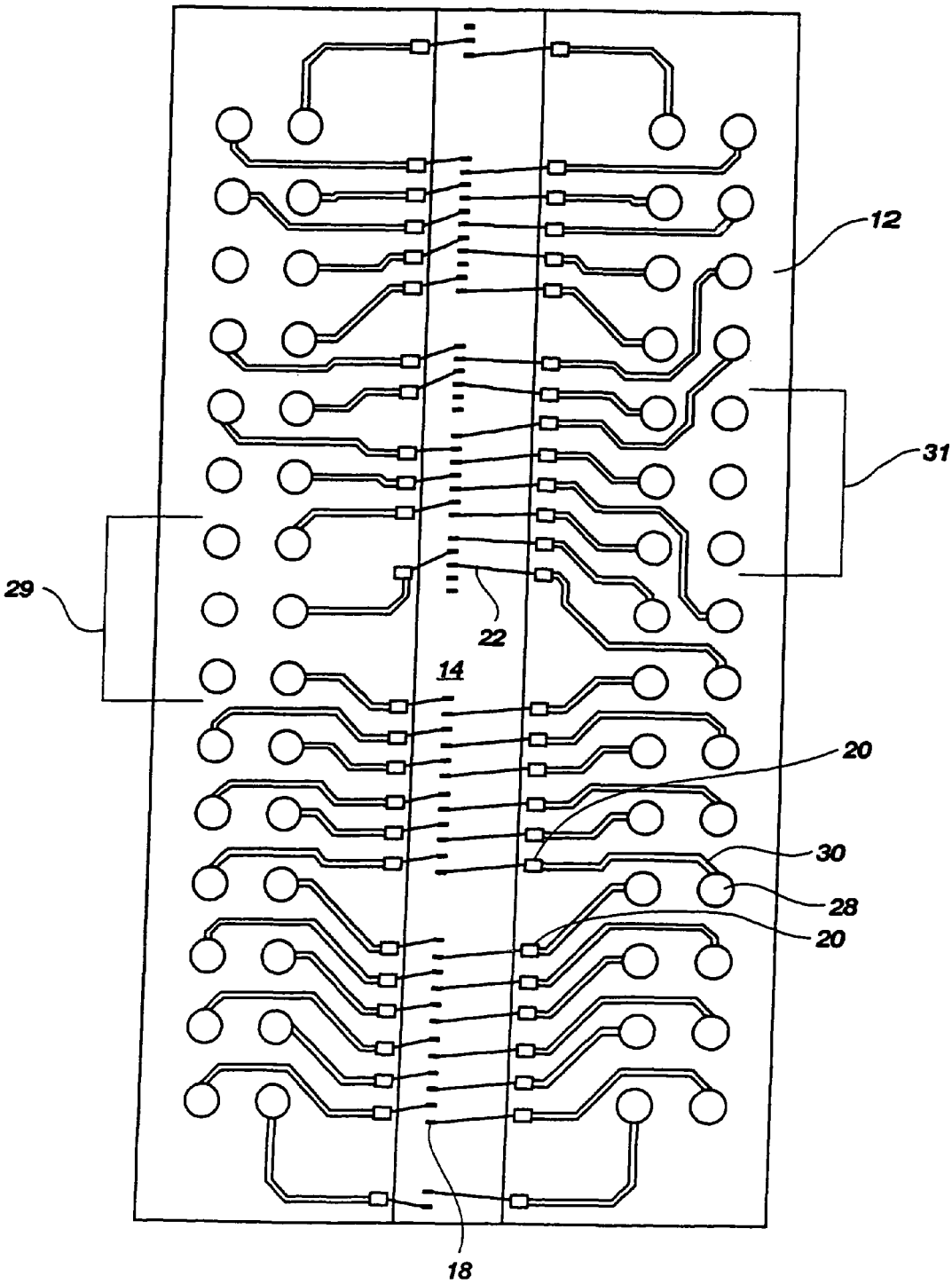
FIG. 9 is a schematic diagram of a view of a printed circuit board having a mounted IC with wire leads attaching the bond pads of the IC to the bond pads of the printed circuit board.

Referring to drawing FIG. 9, illustrated is a schematic diagram of a sample pin and trace layout having isolated connection pads used to connect to the conductive elements 28. As shown, semiconductor die bond pads 18 are aligned in a row down the center of the semiconductor die 14. Wire bonds 22 interconnect bond pads 18 of the semiconductor die 14 to the terminal pads 20 of the substrate 12. From terminal pads 20, conductive traces 30 interconnect conductive elements 28. As can be seen, selected conductive elements 28 have no connection to any of the conductive traces 30 or terminal pads 20 on the substrate 12. These conductive element areas, grouped as 29 and 31, illustrate how certain connections are isolated from that particular semiconductor die 14 mounted on that particular substrate 12. These isolated conductive element areas 29 and 31 allow interconnection among other packages 10 (not shown) stacked one on top of the other within the stacked package arrangement of drawing FIG. 1. The use of selected isolated pins allows for each semiconductor die 14 within the stacked array of packages 10 to have a unique pin out for selected pins on each layer of packages 10. For example, in a memory package of like semiconductor dies 14 stacked in an array, each semiconductor die 14 requires a select pin that is separate from all other select pins of the other semiconductor dies 14 within the array and that connects to a unique pin in the final pin out configuration. The stackable BGA packages are useful in many types of electronic systems including SDRAM, EDO RAM, video RAM, cache memory, and Read-Only Memory (ROM), as well as microprocessors, application specific integrated circuits (ASIC), digital signal processors, flash memories, electrically erasable programmable read only memory (EEPROM), among others.

Figure 10:
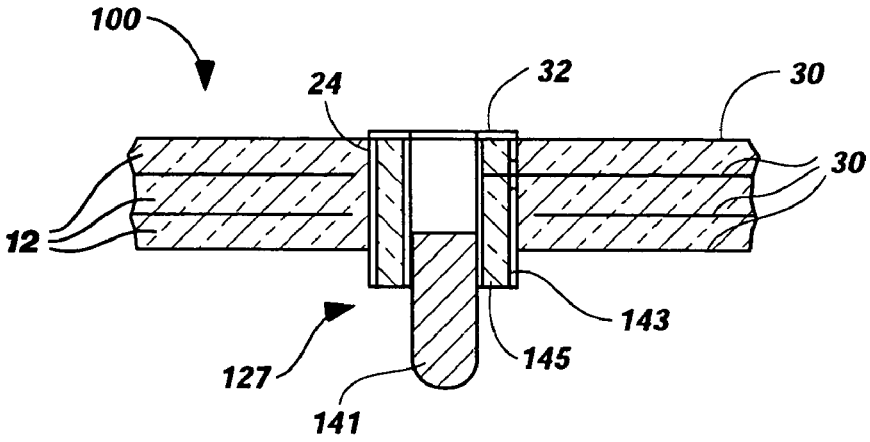
FIG. 10 is a cross-sectional view of a portion of a printed circuit board illustrating the pin and connection therebetween.

Referring to drawing FIG. 10, a connection terminal 100 is illustrated of substrate 12 having conductive traces 30 thereon and therein. The substrate 12 includes conductive traces 30 and an insulator material therebetween, thereby providing the ability of controlling the impedance of the conductive traces 30 having semiconductor die 14 connected thereto by wire bonds 22. The connection terminals 127 include a connection pin 141 which is connected to one of the conductive traces 30. Circuitry in intermediate layers of the substrate 12 extend through apertures 24 in order to permit all connections of the connection pins 141 to be effected through the top of the substrate 12. The terminals include a shield 143, which is separated from the connection pin 141 by an isolation spacer 145. The isolation spacer 145 may be of any material, preferably a dielectric, provided that the isolation spacer 145 permits impedance matched connection through the connection terminals 127. Impedance matching is commonly used for signal transfer applications in which the impedance between signal carrying conductors is a predetermined value per unit length. Changes in length will result in proportional (inverse) changes in impedance, but not changes in the impedance expressed per unit length. The consistent impedance per unit length, colloquially referred to as "impedance value," results in signal matching. This is of interest as operating frequencies exceed those at which unmatched circuits are effective. The use of impedance matched conductors in the present invention of the conductive traces 30, wire bonds 22, and connection terminals 127 therefore facilitates the fabrication of circuits which are inherently impedance matched as desired. Matched impedance is thereby able to reduce spurious signals between semiconductor dies 14, reduce circuit discontinuities, and allow connection circuitry to be designed while controlling the establishment of critical timing paths between components, such as semiconductor dies 14.

Figure 11:
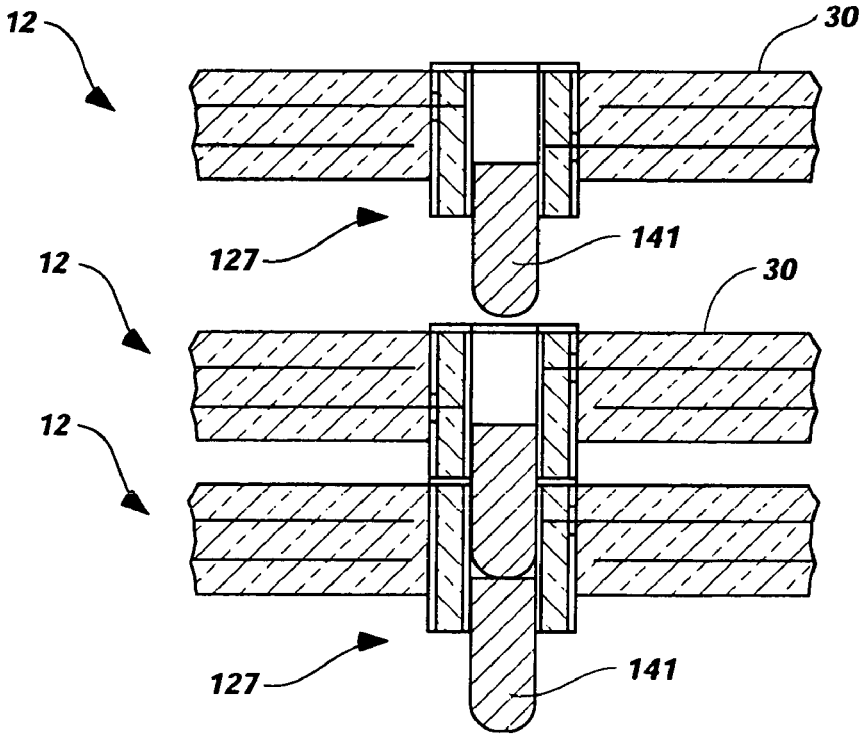
FIG. 11 is a cross-sectional view of portions of printed circuit boards illustrating the pins and connections therebetween.

Referring to drawing FIG. 11, the connection terminals 127 permit the stacking of the substrate 12 with connections formed by connection pins 141.

Figure 12:
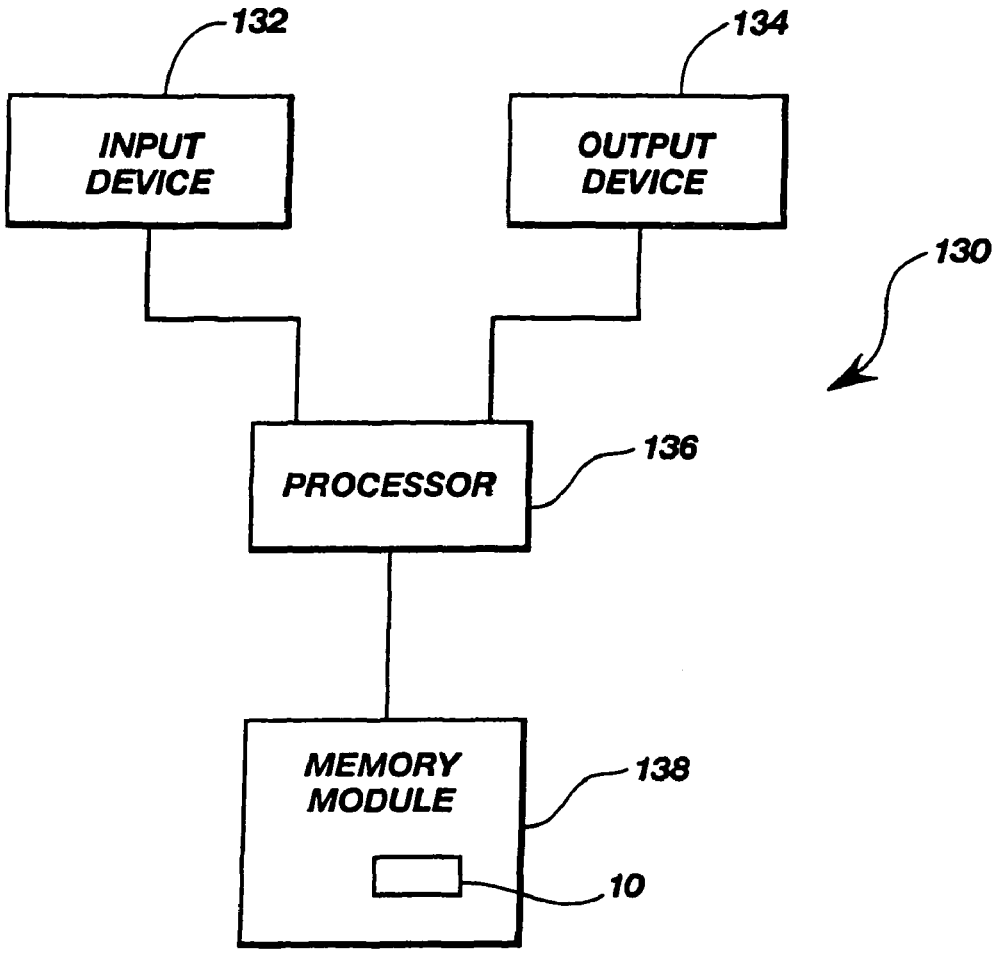
FIG. 12 is a block diagram of an electronic system incorporating the FBGA module of FIG. 1.

Referring to drawing FIG. 12, depicted is an electronic system 130 that includes an input device 132 and an output device 134 coupled to a processor device 136, which, in turn, is coupled to a memory module 138 incorporating the exemplary stackable FBGA package 10 and various embodiments thereof as illustrated in drawing FIGS. 1 through 9. Likewise, even processor device 136 may be embodied in a stackable array package 10 comprising a microprocessor, a first level cache memory, and additional ICs, such as a video processor, an audio processor, or a memory management processor, but not limited thereto.

There has been shown and described a novel semiconductor chip package that is stackable and has a lower profile over that of the prior art. The particular embodiments shown in the drawings and described herein are for purposes of example and are not to be construed to limit the invention as set forth in the pending claims. Those skilled in the art may know numerous uses and modifications of the specific embodiments described without departing from the scope of the invention. The process steps described may, in some instances, be formed in a different order or equivalent structures and processes may be substituted for various structures and processes described.

What is claimed is:

[1. A computer system having an input device, an output device, a processor connected to said input device and said output device, and a memory connected to said processor, comprising:

said memory comprising a memory module connected to said processor, said memory module including:

a ball grid array, comprising:

a printed circuit board substrate having a first surface, a second surface, and an aperture, said first surface including a plurality of conductive element pads, at least one conductive element pad on said second surface and at least one terminal pad on said second surface;

a memory semiconductor device-mounted within a first perimeter of said first surface of said printed circuit board substrate and having at least one bond pad;

at least one wire bond connected to said at least one bond pad on said memory semiconductor device and said at least one terminal pad on said second surface of said printed circuit board substrate while passing through said aperture;

a material placed along said aperture, on said at least one bond pad, said at least one terminal pad, and said at least one wire bond, forming a first profile height; and a plurality of conductive elements, mounted along a second perimeter of said second surface, said second perimeter being greater than said first perimeter, and coupled to said at least one conductive element pad on said second surface, said plurality of conductive elements having a second profile height greater than said first profile height.]

[2. The computer system according to claim 1, wherein a first part of each conductive element of said plurality of conductive elements aligns in a first parallel row having a first pitch spacing.]

[3. The computer system according to claim 2, wherein a second part of each conductive element of said plurality of conductive elements aligns in a second parallel row having a second pitch spacing.]

[4. The computer system according to claim 1, wherein said material has a second profile height less than said first profile height.]

[5. The computer system according to claim 1, wherein said at least one conductive element pad is connected to said at least one bond pad through said printed circuit board substrate.]

[6. The computer system according to claim 1, wherein at least one conductive element of said plurality of conductive elements is isolated.]

*7. A method of forming a stacked semiconductor assembly, comprising:*

*providing a plurality of semiconductor substrates each having a first surface, a second surface, at least one aperture, a plurality of terminal pads on the second surface adjacent the at least one aperture, the terminal pads coupled to conductive element pads on the second surface by conductive traces on the second surface, and a plurality of conductive element pads on the second surface;*

*mounting a respective semiconductor die having a perimeter on the first surface of each of the semiconductor substrates, the semiconductor dies having bond pads on a front surface disposed on the first surface of the respective substrates, the bond pads overlying the at least one aperture in the respective substrates;*

*connecting at least one bond pad of each of the semiconductor dies to at least one of the conductive element pads on the second surface of the respective substrate by connecting one end of a bond wire to a bond pad, extending the bond wire through the at least one aperture, and connecting the opposite end of the bond wire to one of the terminal pads on the second surface on the respective substrates;*

*covering the bond wires and the portion of the semiconductor dies overlying the at least one aperture of each substrate with an encapsulant material, the encapsulant material being disposed in the aperture and projecting beyond the second surface of the respective semiconductor substrate at a first profile height;*

*providing a plurality of conductive elements mounted on the conductive element pads on the second surface of each substrate, the conductive element pads forming a second perimeter on the substrate that is greater than a first perimeter, the conductive elements having a second profile height with respect to the second surface of the respective substrate that is greater than the first profile height, wherein the encapsulant material at the first profile height projects beyond the second surface of the semiconductor substrate such that the encapsulant material is substantially colinear with pairs of the conductive elements that are aligned with a central portion of the second perimeter; and*

*aligning each of the semiconductor substrates in the plurality and positioning the substrates one atop the other such that the conductive elements mounted on the second surface of a first semiconductor substrate of the plurality aligns with and couples to the conductive element pads on the first surface of a second semiconductor substrate of the plurality of substrates, to form a vertically stacked assembly.*

*8. The method of forming the stacked semiconductor assembly of claim 7, wherein providing a plurality of conductive elements further comprises providing solder balls.*

*9. The method of forming the stacked semiconductor assembly of claim 7, wherein mounting a semiconductor die further comprises forming a die attach pad on the first surface of each of the plurality of semiconductor substrates for receiving the respective semiconductor die.*

*10. The method of claim 9, wherein forming a die attach pad further comprises forming an epoxy layer that is a dielectric.*

*11. The method of claim 9, wherein forming a die attach pad further comprises forming a layer of adhesive and tape wherein the tape is a dielectric.*

*12. The method of claim 11, wherein providing the tape further comprises providing a tape with an aperture that aligns with the aperture in the substrate.*

*13. The method of claim 7, wherein mounting the semiconductor dies further comprises providing, for at least one of the semiconductor dies, a memory device.*

*14. The method of claim 13, wherein mounting the semiconductor dies comprises mounting at least one dynamic memory device.*

*15. The method of claim 13, wherein mounting a semiconductor die comprises mounting at least one EPROM device.*

*16. The method of claim 15, wherein mounting an EPROM device comprises mounting a FLASH device.*

*17. The method of claim 7, wherein mounting the semiconductor dies comprises providing a memory device for each of the semiconductor dies.*

*18. The method of claim 7, wherein mounting the semiconductor dies further comprises providing semiconductor dies having bond pads located in the center portion.*

*19. The method of claim 18, wherein providing the substrates with an aperture comprises providing a substrate with a centrally located aperture.*

*20. The method of claim 7, wherein providing the substrates with an aperture comprises providing a substrate with a centrally located aperture.*

*21. A method of forming a substrate for use in a stacked semiconductor ball grid array assembly, comprising:*

*providing a substrate having a first surface, a second surface, and an aperture, providing a plurality of conductive element pads on the first and second surfaces, providing terminal pads located adjacent the aperture on the second surface, providing conductive traces located on the second surface and electrically coupled to at least one of the terminal pads and to at least one of the conductive elements pads, and providing conductive vias extending through the substrate and coupling at least one of the conductive element pads on the first surface to at least one of the conductive element pads on the second surface;*

*disposing a semiconductor die on the first surface of the substrate, the semiconductor die having a perimeter that is less than the perimeter on the first surface, the semiconductor die having bond pads that are placed over the aperture;*

*disposing conductive elements on a perimeter on at least some of the conductive element pads on the second surface and electrically coupling these conductive elements to at least some of the conductive element pads on the first surface through the conductive vias, the conductive elements having a conductive element profile height with respect to the second surface;*

*connecting the bond pads of the semiconductor die to at least one of the terminal pads on the second surface of the substrate by connecting a first end of a bond wire to at least one of the bond pads, extending the bond wire through the aperture, and coupling a second end of the bond wire to at least one of the terminal pads; and*

*disposing encapsulant material over the second surface of the substrate and in the aperture such that the encapsulant material covers the bond wires and a portion of the semiconductor die exposed by the aperture, the encapsulant material projecting beyond the second surface of the substrate at an encapsulant profile height, wherein the encapsulant profile height is less than the conductive element profile height,*

*wherein the encapsulant material projects beyond the second surface such that the encapsulant material is substantially colinear with pairs of the conductive elements that are aligned with a central portion of the second perimeter.*

*22. The method of claim 21, and further comprising disposing conductive elements forming a perimeter on the conductive element pads on the second surface and electrically coupling to at least one of the terminal pads on the second surface via the conductive traces on the second surface, the conductive elements having a conductive element profile height.*

*23. The method of claim 21, and further comprising providing a die attach pad of dielectric material on the first surface of the substrate and located within the perimeter, the die attach pad for receiving a semiconductor device with bond pads to be placed over the aperture in the substrate, the die attach pad having an opening that aligns with the aperture in the substrate.*

*24. The method of claim 21, wherein disposing conductive elements further comprises forming solder balls on the conductive element pads.*

*25. The method of claim 21, and further comprising providing additional conductive element pads on the second surface which are coupled to conductive element pads on the first surface, by forming conductive traces on each surface and coupling the traces to conductive vias through the sub-*

*strate, wherein at least some of these additional conductive element pads provide an electrically isolated path coupling a conductive element pad on the first surface to a conductive element pad on the second surface that is electrically isolated from any terminal pads on the substrate.*

*26. The method of claim 21, wherein disposing the die on the first surface of the substrate further comprises forming a die attach pad on the substrate for receiving the semiconductor die having a thickness and mounting a semiconductor die on the die attach, the semiconductor die having a thickness, the combined thicknesses of the semiconductor die and the die attach pad forming a height with respect to the first surface of the substrate that is less than the conductive element profile height.*

* * * * *